(12) United States Patent
Kubota et al.

(10) Patent No.: US 11,031,257 B2
(45) Date of Patent: Jun. 8, 2021

(54) METHOD FOR MANUFACTURING POWER DEVICE COOLER

(71) Applicant: NIPPON LIGHT METAL COMPANY, LTD., Tokyo (JP)

(72) Inventors: Etsuro Kubota, Shizuoka (JP);
Tomoyuki Hirayama, Shizuoka (JP);
Yutaka Hirano, Shizuoka (JP)

(73) Assignee: NIPPON LIGHT METAL COMPANY, LTD., Tokyo (JP)

( * ) Notice: Subject to any disclaimer, the term of this patent is extended or adjusted under 35 U.S.C. 154(b) by 400 days.

(21) Appl. No.: 16/305,256

(22) PCT Filed: Mar. 3, 2017

(86) PCT No.: PCT/JP2017/008413
§ 371 (c)(1),
(2) Date: Nov. 28, 2018

(87) PCT Pub. No.: WO2017/208550
PCT Pub. Date: Dec. 7, 2017

(65) Prior Publication Data
US 2020/0321224 A1    Oct. 8, 2020

(30) Foreign Application Priority Data
May 30, 2016 (JP) .............................. JP2016-106900

(51) Int. Cl.
*B23K 1/00*      (2006.01)
*H01L 21/48*     (2006.01)
*B23K 103/10*    (2006.01)

(52) U.S. Cl.
CPC ........ *H01L 21/4882* (2013.01); *B23K 1/0008* (2013.01); *B23K 2103/10* (2018.08)

(58) Field of Classification Search
CPC ....... H01L 23/473; B23K 1/0012; B23K 1/19; B23K 1/203; B23K 2101/14;
(Continued)

(56) References Cited

U.S. PATENT DOCUMENTS

| 3,493,476 A * | 2/1970 | Lucas ....................... C23C 2/02 |
| | | 205/193 |
| 5,182,882 A * | 2/1993 | Brodene ................... B24C 3/12 |
| | | 451/36 |

(Continued)

FOREIGN PATENT DOCUMENTS

| JP | 1190828 A2 | 4/1999 |
| JP | 2010171033 A2 | 8/2010 |

(Continued)

OTHER PUBLICATIONS

International Search Report (ISR) dated Apr. 25, 2017 filed in PCT/JP2017/008413.
(Continued)

*Primary Examiner* — Erin B Saad
(74) *Attorney, Agent, or Firm* — Rankin, Hill & Clark LLP

(57) ABSTRACT

To provide a method for manufacturing a power device cooler, which not only can accomplish cost reduction and preferable joining between the cooler and a heating element equipped with a power device but also can improve the productivity. After first and second cases and fins that constitute a cooler are brazed by means of a non-corrosive flux and a brazing filler material, the first and second cases and the fins being made of aluminum, flux residues that are attached at least to a heat receiving surface of the first and second cases that is to be joined to a heating element equipped with a power device, are removed by a wet blasting method in which a mixture of an abrasive formed of polygonal alumina particles having a median particle diameter of 4 to 250 μm and a liquid is projected onto the heat receiving surface by compressed air.

4 Claims, 7 Drawing Sheets

(58) Field of Classification Search
CPC .............. B23K 35/0238; B23K 35/286; B23K 35/288; B23K 1/00; B23K 1/0008; B23K 1/008; B23K 1/20; B23K 1/206; B23K 2103/10; B23K 31/02; B23K 35/002; B23K 35/0222; B23K 35/0233; B23K 35/0244; B23K 35/025; B23K 35/22; B23K 35/28; B23K 35/36; B23K 35/3603; B23K 35/3605; B23K 35/383; F28F 21/084; F28F 1/02

See application file for complete search history.

(56) References Cited

U.S. PATENT DOCUMENTS

| | | | |
|---|---|---|---|
| 7,081,670 B2 * | 7/2006 | Shibuya | H01L 23/3737 257/706 |
| 10,150,186 B2 * | 12/2018 | Yanagawa | F28F 21/084 |
| 2010/0180441 A1 | 7/2010 | Otsuka et al. | |

FOREIGN PATENT DOCUMENTS

| | | |
|---|---|---|
| JP | 2011171569 A2 | 9/2011 |
| JP | 2012047179 A2 | 3/2012 |
| JP | 2012243889 A2 | 12/2012 |
| JP | 2013197185 A2 | 9/2013 |
| JP | 2014192408 A1 | 10/2014 |

OTHER PUBLICATIONS

International Preliminary Report on Patentability dated Dec. 4, 2018 filed in PCT/JP2017/008413, total 5 pages.

\* cited by examiner

METHOD FOR MANUFACTURING POWER DEVICE COOLER

TECHNICAL FIELD

The present invention relates to a method for manufacturing a power device cooler for cooling heat generated from a power device used in a power converter such as an inverter and a converter.

BACKGROUND ART

In general, power devices used for inverter control for electric vehicles, hybrid vehicles, air conditioners, and the like and inverter control for various general-purpose motors and the like handle a large amount of electricity, resulting in increasing heat generation. It is therefore necessary to cool the power devices by dissipating the generated heat.

As this type of conventional cooler, there has been known a cooler configured by braze-joining two aluminum plate members and aluminum fins interposed between these plate members (see PTL 1, for example).

Incidentally, in this type of cooler, a heat receiving surface thereof, which is joined to a heating element (power module) equipped with a power device, needs to ensure a relative roughness of the surface in order to reduce thermal resistance between the heat receiving surface and the heating element (power module). Furthermore, in order to integrally form the cooler by means of, for example, soft soldering, the surface needs to be stabilized so as to be suitably joined to the heating element (power module).

However, non-corrosive flux brazing that uses a non-corrosive flux and a brazing filler material, which is a typical brazing method, causes attachment of flux residues to the surface, which consequently generates fine bumps on the surface, and for this reason the relative roughness cannot be attained. Therefore, the heat receiving surface is smoothened through machining to improve the relative roughness.

CITATION LIST

Patent Literature

[PTL 1] Japanese Patent Application Laid-open No. 2011-171569

SUMMARY OF INVENTION

Technical Problem

Unfortunately, there arises a concern that smoothing the heat receiving surface through machining not only leads to higher costs but also is not suitable for mass production.

The present invention has been made in view of the foregoing circumstances, and an object thereof is to provide a method for manufacturing a power device cooler, which can accomplish cost reduction and preferable joining between the cooler and a heating element equipped with a power device, and also can improve productivity.

Solution to Problem

In order to achieve the foregoing object, the present invention has been made on the basis of a method for manufacturing a power device cooler having: first and second aluminum cases joined together to form a refrigerant circulation space therein; and a plurality of aluminum fins arranged inside the refrigerant circulation space and each forming a refrigerant flow passage along with an adjacent portion, the cooler being joined to a heating element equipped with a power device, to cool heat generated from the power device. An invention according to claim 1 has: a braze-joining step of brazing the first and second cases and the fins by means of a non-corrosive flux and a brazing filler material; and a flux residue removal step of removing flux residues on surfaces of the first and second cases after the brazing, wherein the flux residue removal step is performed by a wet blasting method in which a mixture of an abrasive formed of polygonal alumina particles having a median particle diameter of 4 to 250 μm and a liquid is projected, by compressed air, onto a heat receiving surface of the first and second cases that is joined to the heating element. The abrasive having a median particle diameter of 4 to 250 μm is used because a median particle diameter of 4 μm or larger is favorable for removing the flux residues, and a median particle diameter of 250 μm or smaller provides a relative roughness of 15 μm or less and therefore is favorable for joining the heat receiving surface to the heating element.

According to this configuration, after the first and second cases and the fins are brazed together by means of the non-corrosive flux and the brazing filler material, the flux residues attached to the heat receiving surface of the first and second cases that is joined to the heating element are removed, stabilizing the condition of the heat receiving surface and ensuring the relative roughness of the heat receiving surface.

An invention described in claim 2 includes: a braze-joining step of brazing the first and second cases and the fins by means of a non-corrosive flux and a brazing filler material; and a flux residue removal step of removing flux residues on surfaces of the first and second cases after the brazing, wherein the flux residue removal step is performed by a wet blasting method in which a mixture of an abrasive formed of polygonal alumina particles having a median particle diameter of 4 to 250 μm and a liquid is projected onto the surfaces of the first and second cases by compressed air.

According to this configuration, after the first and second cases and the fins are brazed together by means of the non-corrosive flux and the brazing filler material, the flux residues on the surfaces of the first and second cases can be removed by the wet blasting method, stabilizing the conditions of the surfaces of the first second cases and ensuring the relative roughness of each surfaces.

An invention described in claim 3 further includes, according to the method for manufacturing the power device cooler described in claim 1, a plating step of Ni-plating the heat receiving surface from which the flux residues are removed.

According to this configuration, Ni-plating the heat receiving surface from which the flux residues are removed can achieve favorable joining between the heat receiving surface and the heating element. In addition, a Ni-plated film of uniform thickness can be formed on the heat receiving surface.

An invention described in claim 4 further includes, according to the method for manufacturing the power device cooler described in claim 2, a plating step of Ni-plating a surface of the first and second cases from which the flux residues are removed.

According to this configuration, Ni-plating the surfaces of the first and second cases from which the flux residues are removed can achieve favorable joining between the surfaces and the heating element. In addition, a Ni-plated film of uniform thickness can be formed on the surfaces of the first and second cases.

Advantageous Effects of Invention

According to the present invention, the following effects can be achieved by the configurations described above.

(1) According to the invention described in claim 1, since the condition of the heat receiving surface of the first and second cases that is joined to the heating element is stabilized to ensure the relative roughness thereof, not only is it possible to accomplish cost reduction and favorable joining between the heat receiving surface and the heating element equipped with a power device, but also the productivity can be improved.

(2) According to the invention described in claim 2, since the condition of the surface including the heat receiving surface of the first and second cases that is joined to the heating element is stabilized to ensure the relative roughness thereof, the appearance of the exterior of the cooler can be improved in addition to accomplishing the effect (1) described above.

(3) According to the invention described in claim 3, by Ni-plating the heat receiving surface, not only is it possible to realize favorable joining between the heat receiving surface and the heating element but also a Ni-plated film of uniform thickness can be formed on the heat receiving surface. Therefore, in addition to the effects of (1) above, the heat receiving surface can favorably be joined to the heating element equipped with the power device, and the quality of the cooler can be improved.

(4) According to the invention described in claim 4, by Ni-plating the surface of the first and second cases, the surface can favorably be joined to the heating element and a Ni-plated film of uniform thickness can be formed on the surface of the first and second cases. Therefore, in addition to the effects of (2) above, the surface can favorably be joined to the heating element equipped with the power device, and the appearance of the exterior of the cooler and the quality of the cooler can be improved.

DESCRIPTION OF EMBODIMENTS

Figure 1:
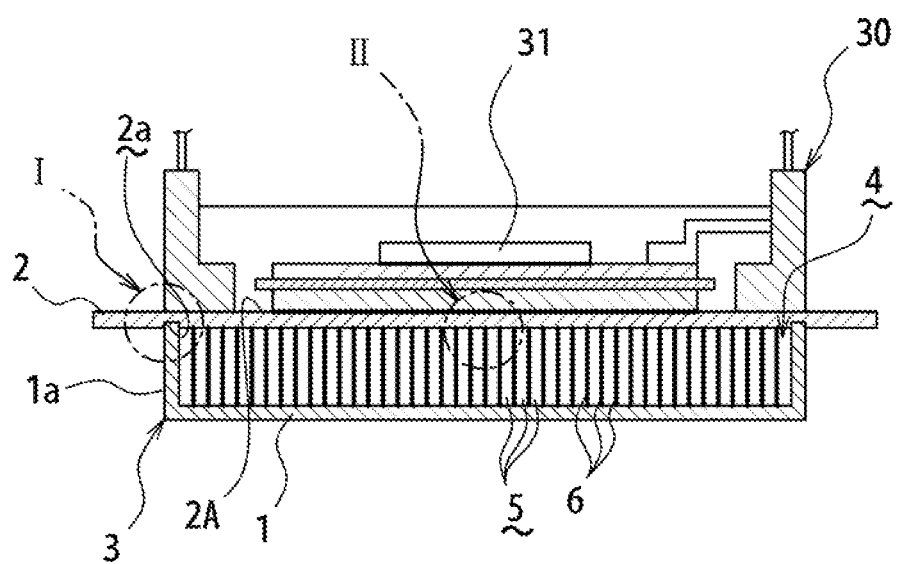
FIG. 1 is a cross-sectional view, showing a cooler according to the present invention joined to a power module which is a heating element.
Figure 2:
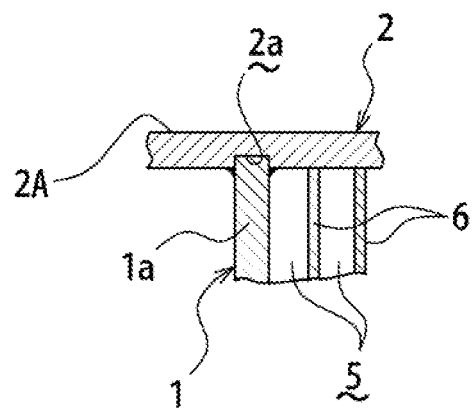
FIG. 2 is an enlarged cross-sectional view of part I of FIG. 1.

Embodiments of a cooler according to the present invention and a method for manufacturing the cooler are now described hereinafter in detail with reference to the accompanying drawings.

<Cooler>

As shown in FIGS. 1 to 4, a cooler 1 according to the present invention has a first case 1 and a second case 2 made of aluminum alloy that are joined to each other to form a refrigerant circulation space 4 therein, and a plurality of fins 6 made of aluminum (including aluminum alloy) that are arranged in the refrigerant circulation space 4 and each form a refrigerant flow passage 5 along with an adjacent portion, wherein the first and second cases 1, 2 and the fins 6 are joined by a non-corrosive flux and a brazing filler material. In this configuration, of the first and second cases 1 and 2, a surface of the second case 2 is plated with Ni, the surface being a heat receiving surface 2A to be joined to a power module 30 serving as a heating element equipped with a power device 31.

In this configuration, the first case 1, which is one of the cases, is shaped into a substantially rectangular box with the upper side thereof opened. The second case 2, which is the other case, is shaped into a substantially rectangular plate larger than the first case 1, and a peripheral groove 2a, with which opening-side end portions of respective side wall portions 1a on the four sides of the first case 1 can come into engagement, is provided on the inside of a peripheral portion of the second case 2 (see FIG. 2).

As a result of braze-joining the first case 1 and the second case 2 together, with the opening-side end portions of the side wall portions 1a of the first case 1 being engaged with the peripheral groove 2a provided on the inside of the peripheral portion of the second case 2, a cooler main body 3 having the refrigerant circulation space 4 is configured.

The fins 6 are each formed from a plate member and are arranged at equal intervals along a longitudinal direction of the refrigerant circulation space 4, with a refrigerant inflow region 8 and a refrigerant outflow region 9 being left open in a traverse direction of the refrigerant circulation space 4 and with straight portions at both ends of the refrigerant circulation space 4 being positioned in the traverse direction. As a result, refrigerant flow passages 5 are formed between the fins 6. Note that the entire shape of each of the fins 6 does not always have to be straight. Each of the fins 6 may have an arc-shaped, continuous waveform portion.

It should be noted that the refrigerant inflow region 8 is provided with a refrigerant inlet 8a and the refrigerant outflow region 9 is provided with a refrigerant outlet 9a. In such a case, the refrigerant inlet 8a is provided on the first case 1 via a bracket 10a, and the refrigerant outlet 9a is provided on the same via a bracket 10b.

The first and second cases 1, 2 are each formed of a brazeable alloy, such as a 6063 alloy. Specifically, the first and second cases 1, 2 are each formed of an aluminum alloy having a composition including 0.6% by mass of silicon, 0.35% by mass of iron, 0.1% by mass of copper, 0.1% by mass of manganese, 0.9% by mass of magnesium, 0.1% by mass of chromium, 0.1% by mass of zinc, 0.01% by mass of titanium, and aluminum and inevitable impurities as the remainders. Note that the material of the first and second cases 1, 2 is not necessarily the 6063 alloy; other brazeable aluminum alloys may be used. Moreover, the first and second cases 1, 2 may each be a brazing sheet using the same alloy as the core material thereof.

The fins 6 are formed of the 6063 alloy, the same material as that of the first and second cases 1, 2. In this case, the fins 6 may be formed of a brazing sheet cladded with a brazing filler material having the 6063 alloy as the core material thereof.

A fluoride-based flux such as $KAlF_4+K_3AlF_6$ is used as the non-corrosive flux, and this non-corrosive flux is applied to surfaces of the first and second cases 1, 2 when brazing the first and second cases 1, 2 and the fins 6 together.

This flux brazing using the non-corrosive flux described above has favorable brazeability due to the function of the flux that promotes fillet formation of wax by reacting with the wax.

<Method for Manufacturing the Cooler>

Figure 7:
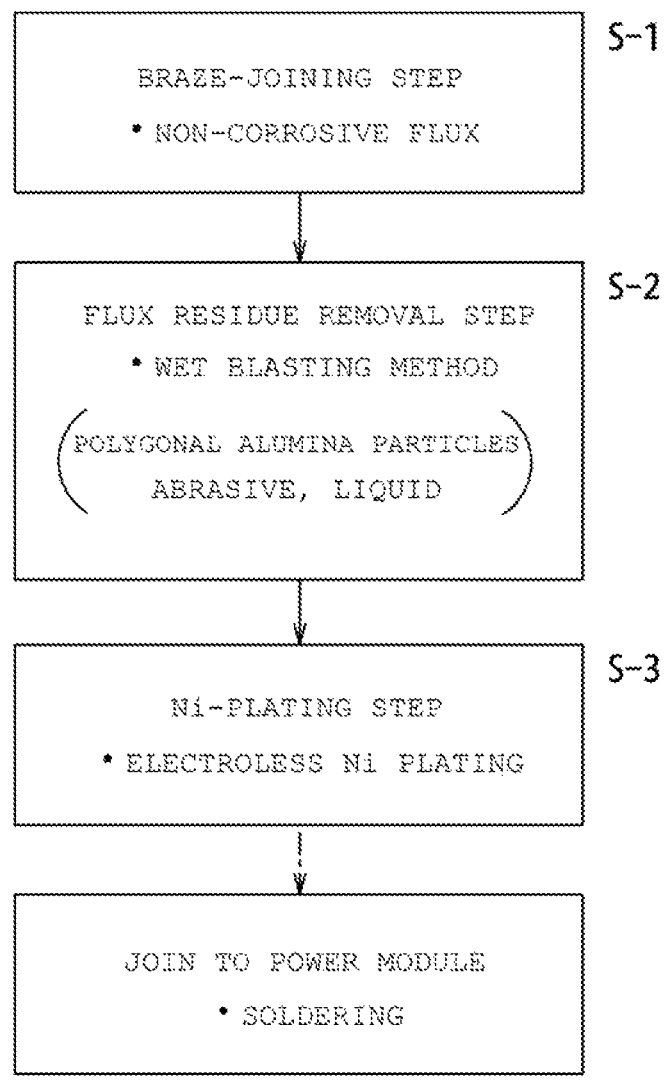
FIG. 7 is a flowchart showing the steps of a method for manufacturing the cooler according to the present invention.

The method for manufacturing the cooler is described next with reference to FIG. 7.

(S-1) Prior to brazing, a mixture of Si powder having a brazing effect, the non-corrosive flux, and an acrylic binder, is adhered to the surfaces of the first and second cases 1, 2. Thereafter, the first and second cases 1, 2 and the fins 6 are combined and heated in a furnace at a predetermined temperature for brazing (braze-joining step).

(S-2) Flux residues remaining on surfaces of the brazed cooler (cooler main body 3) are removed by a wet blasting method in which a mixture of an abrasive formed of polygonal alumina particles having a median particle diameter of 4 to 250 μm and a liquid is projected onto the heat receiving surface 2A on the surface of the second case 2 by compressed air (flux residue removal step).

In order to remove the flux residues attached to the surfaces of the first and second cases 1, 2, after or prior to removing the flux residues on the surface of the second case 2 by means of the wet blasting method in which the mixture of an abrasive formed of polygonal alumina particles having a median particle diameter of 4 to 250 μm and a liquid is projected onto the heat receiving surface 2A on the surface of the second case 2 by compressed air, the flux residues attached to the surface of the first case 1 are removed by means of the same wet blasting method for projecting the mixture of the abrasive and the liquid.

Figure 8:
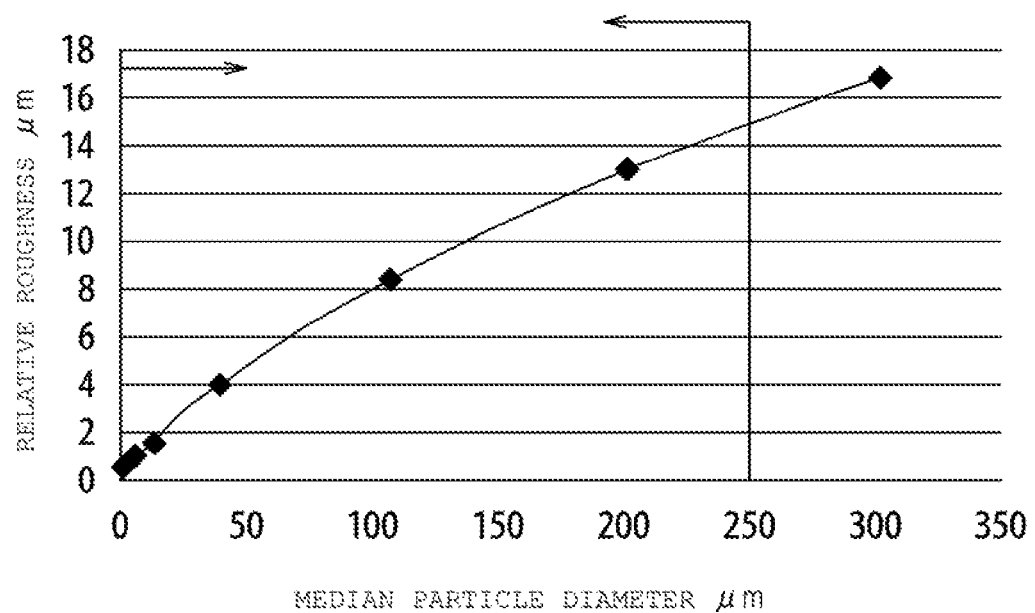
FIG. 8 is a graph showing a relation between a median particle diameter of an abrasive and a relative roughness, according to the present invention.

The reason that the abrasive having a median particle diameter of 4 to 250 μm is selected because, as shown in FIG. 8, a median particle diameter of 4 μm or larger is a range favorable for removing the flux residues, and a median particle diameter of 250 μm or smaller provides a relative roughness of 15 μm or less and therefore is a range favorable for joining the heat receiving surface 2A to the power module 30.

Figure 6:
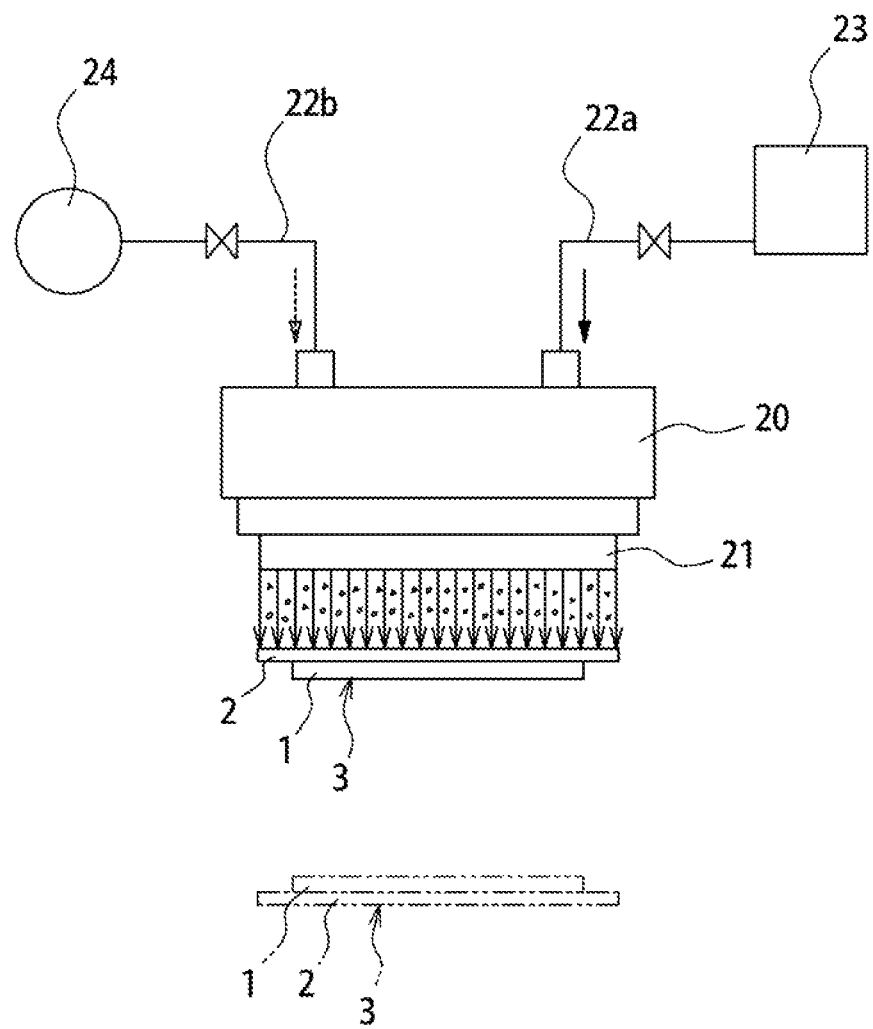
FIG. 6 is a schematic side view of a wet blasting device, showing a principle of a wet blasting method according to the present invention.

This flux residue removal method is executed using a wet blasting device shown in FIG. 6. The wet blasting device has a projection gun 20 that is provided with a wide nozzle 21 at a lower portion thereof, a slurry tank 23 for storing the mixture of the abrasive and the liquid (water), the slurry tank 23 being connected to the projection gun 20 through a supply pipe 22a, and a compressor 24, which is a compressed air supply source connected to the projection gun 20 through a supply pipe 22b. Note that FIG. 6 shows how the mixture of the abrasive and the liquid is projected onto the surface of the second case 2, i.e., the heat receiving surface 2A. However, in order to project the mixture of the abrasive and the liquid onto the surfaces of the first and second cases 1, 2, the top and bottom of the first and second cases 1, 2 are reversed as shown by the dotted and dashed lines in FIG. 6, and then the mixture of the abrasive and the liquid is projected onto the surface of the first case 1.

Removal of the flux residues is performed by treating the surfaces by using the collision of the abrasive and the liquid (water) which are accelerated by the compressed air, against the cooler. After such surface treatment, the abrasive becomes washed away by the voluminous liquid (water) so that the surfaces are free of abrasive residue at all times, and then the collision of a subsequent abrasive treats the surfaces, removing the flux residues.

(S-3) After the flux residues are removed, the heat receiving surface 2A or the surfaces of the first and second cases 1, 2 from which the flux residues are removed are plated with Ni (plating step). In this case, the plating processing is performed by electroless Ni plating using the reducing power of the cooler (cooling main body 3) without using electricity. Note that a pretreatment step and a post-treatment step are provided before and after the plating step, but the explanations thereof are omitted herein.

Figure 3:
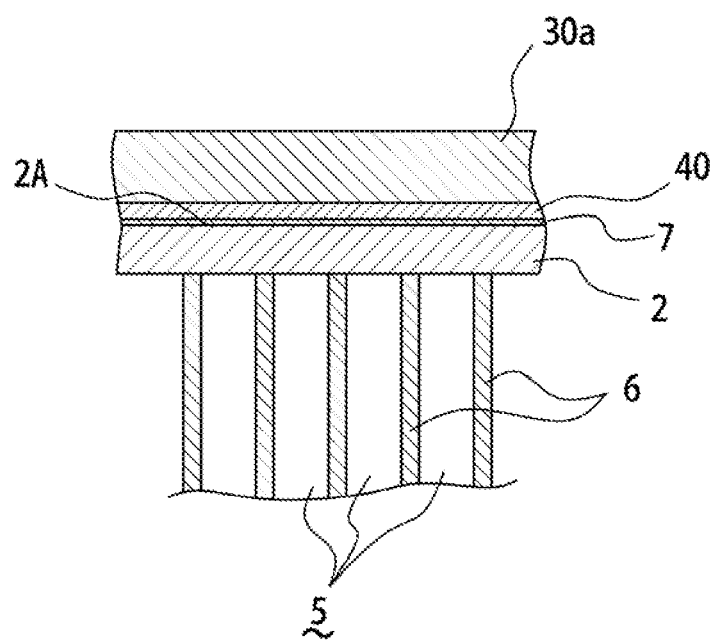
FIG. 3 is an enlarged cross-sectional view of part II of FIG. 1.
Figure 4:
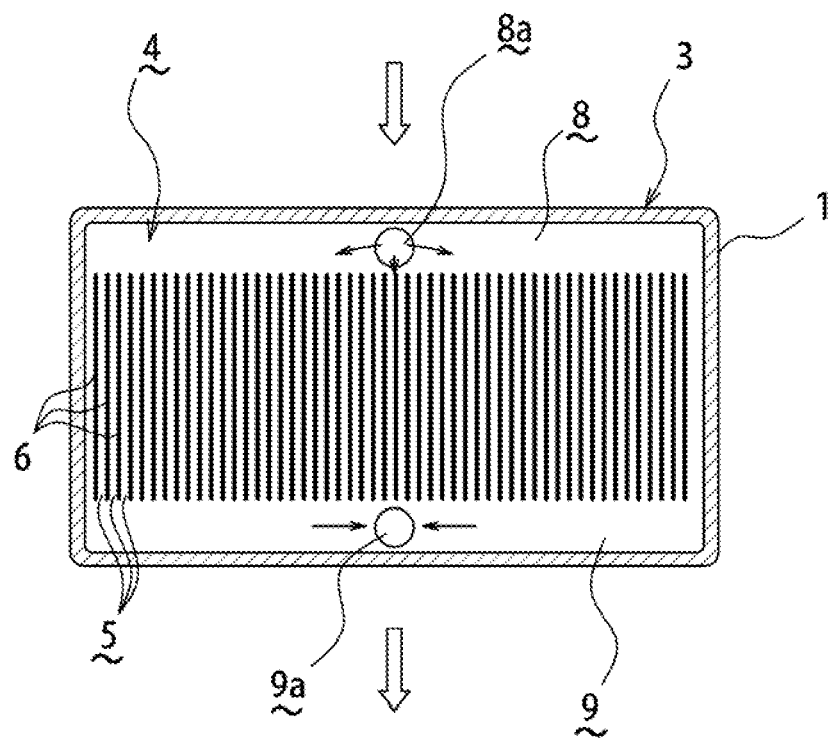
FIG. 4 is a lateral cross-sectional view of the cooler according to the present invention.
Figure 5:
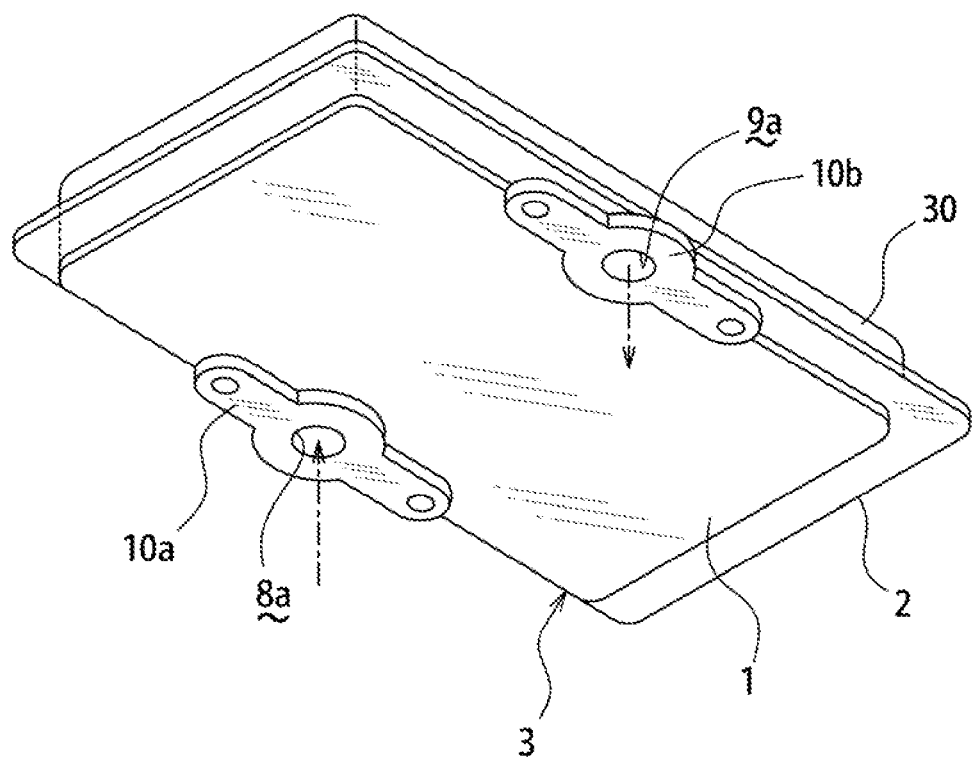
FIG. 5 is a lower perspective view of the cooler according to the present invention.

After being subjected to the Ni plating processing, the cooler is joined to the power module 30 which is a heating element equipped with the power device 31. In this case, the top surface of the second case 2 (the heat receiving surface 2A) and a lower surface of a lower portion 30a of the power module 30 are joined by a solder 40 (see FIG. 3). Note that reference numeral "7" shown in FIG. 3 represents a plated film layer.

The method for manufacturing the cooler according to the foregoing embodiment can stabilize the condition of the heat receiving surface 2A of the first and second cases 1, 2 that is joined at least to the power module 30, and thereby ensure the relative roughness of the heat receiving surface 2A, resulting in accomplishing cost reduction and improvement of the productivity.

Moreover, because a Ni-plated film of uniform thickness can be formed on the surface of at least the second case 2 out of the first and second cases 1, 2, the surface being the heat receiving surface 2A, the cooler can be joined favorably to the power module 30.

After removing the flux residues attached to the surfaces of the first and second cases 1, 2, the Ni-plated film of uniform thickness is formed on the surface of the first and second cases 1, 2, improving the appearance of the exterior of the cooler and the quality of the cooler.

According to the foregoing embodiment, the cooler is joined to one side of the power module 30. However, the same effects can be achieved by joining the cooler to either side of the power module 30.

REFERENCE SIGNS LIST

1 First case
2 Second case
2A Heat receiving surface
3 Cooler main body
4 Refrigerant circulation space
5 Refrigerant flow passage
6 Fin
7 Plated film layer
30 Power module (heating element)
31 Power device

The invention claimed is:

1. A method for manufacturing a power device cooler having: first and second aluminum cases joined together to form a refrigerant circulation space therein; and a plurality of aluminum fins arranged inside the refrigerant circulation space and each forming a refrigerant flow passage along with an adjacent portion, the cooler being joined to a heating element equipped with a power device, to cool heat generated from the power device, the method comprising:

a braze-joining step of brazing the first and second cases and the fins by means of a non-corrosive flux and a brazing filler material; and a flux residue removal step of removing flux residues on surfaces of the first and second cases after the brazing, wherein the flux residue removal step is performed by a wet blasting method in which a mixture of an abrasive formed of polygonal alumina particles having a median particle diameter of 4 to 250 μm and a liquid is projected, by compressed air, onto a heat receiving surface of the first and second cases that is joined to the heating element.

2. A method for manufacturing a power device cooler having: first and second aluminum cases joined together to form a refrigerant circulation space therein; and a plurality of aluminum fins arranged inside the refrigerant circulation space and each forming a refrigerant flow passage along with an adjacent portion, the cooler being joined to a heating element equipped with a power device, to cool heat generated from the power device, the method comprising:

a braze-joining step of brazing the first and second cases and the fins by means of a non-corrosive flux and a brazing filler material; and
  a flux residue removal step of removing flux residues on surfaces of the first and second cases after the brazing,
  wherein the flux residue removal step is performed by a wet blasting method in which a mixture of an abrasive formed of polygonal alumina particles having a median particle diameter of 4 to 250 μm and a liquid is projected onto the surfaces of the first and second cases by compressed air.

3. The method for manufacturing the power device cooler according to claim 1, further comprising a plating step of plating, with Ni, the heat receiving surface from which the flux residues has been removed.

4. The method for manufacturing the power device cooler according to claim 2, further comprising a plating step of plating, with Ni, the surfaces of the first and second cases from which the flux residues has been removed.

* * * * *